US012176682B2

(12) United States Patent
Smits et al.

(10) Patent No.: US 12,176,682 B2
(45) Date of Patent: Dec. 24, 2024

(54) INFRARED-LASER SOURCE DEVICE

(71) Applicant: Aptiv Technologies AG, Schaffhausen (CH)

(72) Inventors: Soeren Smits, Neustadt (DE); Detlef Wilke, Sibbesse (DE); Albrecht Haack, Wuppertal (DE)

(73) Assignee: Aptiv Technologies AG, Schaffhausen (CH)

( * ) Notice: Subject to any disclaimer, the term of this patent is extended or adjusted under 35 U.S.C. 154(b) by 405 days.

(21) Appl. No.: 17/647,327

(22) Filed: Jan. 6, 2022

(65) Prior Publication Data

US 2022/0231482 A1 Jul. 21, 2022

(30) Foreign Application Priority Data

Jan. 18, 2021 (GB) ..................................... 2100638

(51) Int. Cl.
*H01S 5/183* (2006.01)
*B60Q 3/60* (2017.01)
*B60R 11/04* (2006.01)
*H04N 5/33* (2023.01)

(52) U.S. Cl.
CPC ............ *H01S 5/18386* (2013.01); *B60Q 3/60* (2017.02); *B60R 11/04* (2013.01); *H04N 5/33* (2013.01)

(58) Field of Classification Search
CPC .. H01S 5/18386; H01S 5/005; H01S 5/18338; H04N 5/33; B60Q 3/60
See application file for complete search history.

(56) References Cited

U.S. PATENT DOCUMENTS 10,095,040 B2 10/2018 Ronen et al.
2002/0003571 A1* 1/2002 Schofield .................. B60R 1/04
348/148
2005/0121892 A1 6/2005 Li et al.
(Continued)

FOREIGN PATENT DOCUMENTS

CN 102709808 10/2012
CN 110649466 1/2020
(Continued)

OTHER PUBLICATIONS

"Extended European Search Report", EP Application No. 22150411. 1, May 31, 2022, 11 pages.
(Continued)

*Primary Examiner* — Kathleen V Nguyen
(74) *Attorney, Agent, or Firm* — Harness, Dickey & Pierce, P.L.C.

(57) ABSTRACT

An infrared-laser source device provided with an external housing, said external housing comprising: a light output interface arranged in a front part of the external housing, at least one infrared-laser source arranged in a rear part of the external housing and configured to emit an IR-laser beam providing a first emitting area at the light output interface, and a first light distributing element configured to diverge light at the light output interface, wherein said infrared-laser source device further comprises a second light distributing element separated from the first light distributing element and providing, at the light output interface, a second emitting area larger than the first emitting area.

19 Claims, 5 Drawing Sheets

(56) References Cited

U.S. PATENT DOCUMENTS

| | | | |
|---|---|---|---|
| 2015/0070489 A1* | 3/2015 | Hudman | A63F 13/213 |
| | | | 348/135 |
| 2016/0085078 A1* | 3/2016 | Ronen | G02B 21/361 |
| | | | 348/79 |
| 2016/0241796 A1* | 8/2016 | Curreri | G02B 6/04 |
| 2018/0129027 A1* | 5/2018 | Jurik | G02B 27/0994 |
| 2020/0310005 A1* | 10/2020 | Carson | G02B 19/0066 |
| 2023/0136630 A1* | 5/2023 | Cai | A61B 18/203 |
| | | | 606/18 |

FOREIGN PATENT DOCUMENTS

| | | |
|---|---|---|
| EP | 2478602 | 12/2014 |
| EP | 3060957 | 12/2017 |
| EP | 3373049 A1 | 9/2018 |
| EP | 3382828 | 10/2018 |
| EP | 3598591 | 1/2020 |
| WO | 2014012909 | 1/2014 |
| WO | 2015038443 | 3/2015 |
| WO | 2019020395 | 1/2019 |
| WO | 2020057208 | 3/2020 |
| WO | 2020184638 | 9/2020 |

OTHER PUBLICATIONS

"Combined Search and Examination Report", GB Application No. 2100638.2, Jun. 16, 2021, 7 pages.

* cited by examiner

INFRARED-LASER SOURCE DEVICE

CROSS-REFERENCE TO RELATED APPLICATION

This application claims priority to United Kingdom Patent Application Number 2100638.2, filed Jan. 18, 2021, the disclosure of which is hereby incorporated by reference in its entirety herein.

BACKGROUND

Today, laser diodes are used in a wide variety of sectors such as medicine, telecommunications, and entertainment for example. However, one of the preferred applications to which the present disclosure refer is the field of optical detection for monitoring purposes. Among the different types of laser sources there is the vertical-cavity surface-emitting laser, or VCSEL, that is a type of semiconductor laser diode with laser beam emission perpendicular from the top surface, contrary to conventional edge-emitting semiconductor lasers. With 940 nm emission wavelength, or similar wavelength in the near-infrared (NIR), such laser sources are at the cutting edge of the lighting technology. The main advantages are the small size, narrow infrared (IR) emission bandwidth, resulting in a high sunlight immunity, high output power and good efficiency. As prices are getting more and more attractive, VCSELs are planned to be used for many upcoming driver and in-cabin monitoring camera projects.

Unfortunately, the high power combined with the small size, creates very high intensities on the light emitting surface. When looking at the source from the front, this creates retinal projections in the human eye with high intensities leading to a perceptibility of IR-light that is visible as dark-red-glow, whereas the IR-light is supposed to be invisible for the human eye. Such a dark-red-glow may disturb or dazzle the driver which has his face in the field of lighting. This issue is not limited to VCSELs but may occur with other types of laser diodes providing beams in the NIR range.

Existing laser sources typically used e.g. for in-cabin monitoring drivers behaviors of motor vehicles, are provided with a single diffusing element playing the role of light distributing element of the laser beam that is initially emitted in a single direction. A micro lens array is usually used to distribute the laser light across the scene, i.e. towards the face of the drivers according to the aforementioned example.

There is a need to overcome the aforementioned issues and drawbacks at least partially, especially to improve safety and comfort of any person present in a light field illuminated by an infrared-laser source.

SUMMARY

The present disclosure relates to the field of laser source devices, especially infrared-laser source devices that are typically used for illuminating a scene that need to be observed by a monitoring camera. Such infrared-laser source devices are particularly efficient to illuminate a dark or nocturnal scene. More specifically, the beams provided by such infrared-laser source devices are directed, or likely to be oriented, towards a human face which must not be blinded or dazzled for safety or comfort reasons. The present disclosure also relates to a lighting device, e.g. for a monitoring camera, which comprises such an infrared-laser source device, as well as a vehicle, especially a motor vehicle, equipped with such a lighting device.

Due to the infrared-laser source device of the present disclosure, the radiance of the laser exiting surface at the light output interface of the device can be reduced while maintaining the desired angular distribution and power of the light on the target surface of the illuminated scene. In other words, the problem caused by high light intensities at the output interface is solved by increasing the size of the light emitting area that is visible to the human eye if it looks at the exiting surface of the external housing of the infrared-laser source device. Advantageously, the present disclosure does not reduce the light power provided by the laser source onto the illuminated scene. Furthermore, the light distribution, provided by the angular exit distribution of the light, on the target surface of the scene may also be maintained. In addition, these technical effects and the aforementioned advantages can be obtained without significantly increasing the height of the external housing of the infrared-laser source device.

According to one embodiment, the IR-laser beam emitted by the infrared-laser source is in a near-infrared range. For example, the IR-laser beam may comprise 940 nm emission wavelength.

According to a preferred embodiment, the infrared-laser source is a vertical-cavity surface-emitting laser (VCSEL).

In one embodiment, at least one of the first light distributing element and the second light distributing element is made of at least one of a micro-lens array, a translucent material, a grained surface, a free-form lens or an advanced beam shaper capable of homogenizing an input beam while shaping the output intensity profile and the way light is distributed in space.

In another embodiment, the distance between the first light distributing element and the second light distributing element is made variable by an adjusting means.

According to one embodiment, the second light distributing element is located at a distance comprised between 2 and 5 mm from the first light distributing element.

In a further embodiment, the infrared-laser source is made of a single element and the second light distributing element is substantially located halfway between the infrared-laser source and the first light distributing element.

In a different embodiment, the infrared-laser source is made of a plurality of separated elements and the second light distributing element is made of a micro-lens arranged onto each of said elements. Preferably, the second light distributing element is located at a distance which is substantially greater than the spacing between the separated elements of the second light distributing element.

According to one embodiment, the first light distributing element 15 further widens the IR-laser beam that exits the second light distributing element and/or corrects the distribution of at least one portion of said IR-laser beam.

According to one embodiment, the infrared-laser source and the second light distributing element are arranged within an internal housing which is located inside the external housing. The external housing is preferably an add-on with respect to the internal housing.

In another embodiment, at least one of the external housing and the internal housing comprises a translucent material, preferably plastic or glass, acting as light output interface.

In a further embodiment, at least one of the first light distributing element and the second light distributing element is integrated to or arranged against the external housing, respectively the internal housing.

The present disclosure also relates to a lighting device, preferably a lighting device for a monitoring camera, which comprises the infrared-laser source device according to any of its embodiment or according to any possible combination of its embodiments.

The present disclosure further relates to a vehicle, preferably a motor vehicle, comprising the lighting device mentioned above.

Other embodiments and advantages will be disclosed hereafter in the detailed description.

BRIEF DESCRIPTION OF THE DRAWINGS

The disclosure and the embodiments suggested in the present disclosure should be taken as non-limitative examples and will be better understood with reference to the attached Figures in which.

DETAILED DESCRIPTION

In some previous examples, a light source device including a plurality of light emitters and a projection optical system configured to a magnification of the light emission amount per unit area in the light emission region. In still other previous examples, a VCSEL assembly including a plurality of individually addressable infrared-emitting VCSELs arranged in a VCSEL array; a controller arranged to address individual VCSELs of the VCSEL array; and a plurality of primary optics elements arranged in a primary optics array. This assembly allows to adjust the illuminance over relatively small scene regions, e.g. regions as small as the arm and chest or eyes and nose of a person in such a scene.

Another previous example relates to a laser arrangement including a laser array and especially a Vertical Cavity Surface Emitting Laser (VCSEL) array provided with a diffusor, a lighting device including a laser or VCSEL array and a time-of-flight camera including such a laser arrangement. One of the main goals of this document is to provide an arrangement with reduced building height.

In yet another example relates to a laser device with configurable intensity distribution. The main object disclosed in this document is to provide a laser device which allows a generation of a desired intensity distribution in the working plane without the need of an optics specially designed for this intensity distribution or beam profile.

None of these prior examples can overcome the issue resulting from the aforementioned dark-red-glow. Accordingly, there is a need to overcome the aforementioned issues and drawbacks at least partially, especially to improve safety and comfort of any person present in a light field illuminated by an infrared-laser source.

As general matter, it should be noted that the sizes and the ratios of the elements shown in the appended figures are not respected but have been greatly exaggerated so as to privilege the general principle of the device's operation and device's layout. This is why these figures are mainly qualified as being schematic representations.

Figure 1:
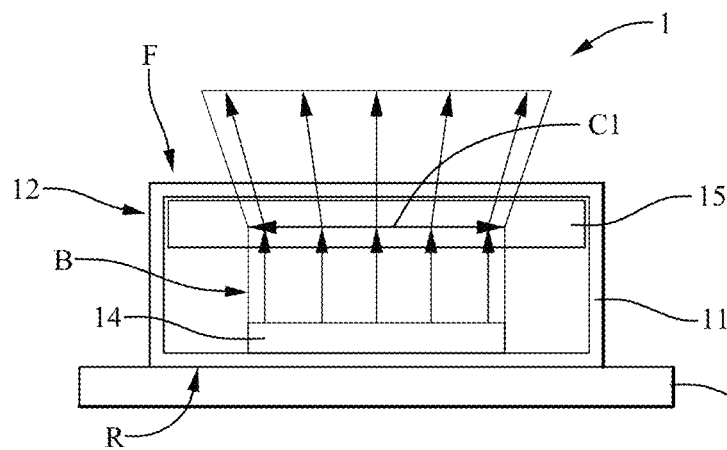
FIG. 1 is a schematic representation of a laser source device according to the prior art.

FIG. 1 provides a schematic illustration of a laser source device 1 according to the prior art. Such a device typically includes an external housing 11 that may be mounted onto a printed circuit board 20. The housing 11 includes, in its front part F, a light output interface 12 that may consist of a transparent or translucent portion arranged within the housing 11 such as a laser light permeable window.

The external housing 11 further includes, in its rear part R, an infrared-laser source 14 that is able to emit an IR-laser beam B. At the output of the source 14, the laser beam B is, as any laser beam, pointing toward a single direction and made of a single wavelength. As a result, the laser beam B is originally a parallel beam as schematically depicted in FIG. 1. The size of the laser beam B mainly depends on the size of the infrared-laser source 14. Actually, the source 14 may be made up of a plurality of micro-laser sources arranged in an array for example. The IR-laser beam B emitted by the infrared-laser source 14 further provides a first emitting area C1 at the light output interface 12, or substantially at the light output interface 12.

Finally, the external housing 11 of FIG. 1 also includes a light distributing element 15 aiming to diverge the light at the light output interface 12. Accordingly, the light provided by the emitting area C1 towards the outside of the housing 11 is no longer a parallel beam but a divergent beam that is thus more suitable to illuminate a target object, person or surface within a monitoring scene for example.

As schematically depicted in FIG. 1, as well as in some other figures, the light output interface 12 can preferably be regarded as including the light distributing element 15 given that the thickness of such an element is much smaller than depicted in the schematic representation provided by the appended figures. In addition, it should be also noted that the emitting area C1 has been schematically represented in the middle of the thickness of the light distributing element 15, so as to comply with the optical scheme showing the change in cross-sectional area within the laser beam B caused by the light distributing element 15. However, since the light distributing element 15 is located against the front part F of the external housing 11, or even integrated therein, and since the thickness of the optical element is much smaller than depicted in the figures, one can consider that the emitting area C1 corresponds to the coverage provided by the laser beam B on the external face of the housing 11, as it would appear for a person looking at the infrared-laser source device 1 from the front.

The main issue of the laser source device 1 of FIG. 1 lies in the fact that a person looking at the infrared-laser source device 1 from the front can be disturbed or dazzled by a dark-red glow caused by the radiance of the IR-laser beam B. Indeed, due to the high light power of the infrared-laser source 14 and the small coverage provided by the emitting area C1 at the light output interface 12, the IR-light becomes visible for the human eye, especially within the near-infrared (NIR) spectra, while IR-light (including NIR-light) is supposed to be invisible for the human eye. As a result, prevention of eye safety limits or eye confusion are harder to reach with the needed system performance, in particular in the case where illuminating device, such as that of FIG. 1, is used for monitoring human behaviors, e.g. using in-cabin monitoring camera pointed towards human faces.

Figure 2:
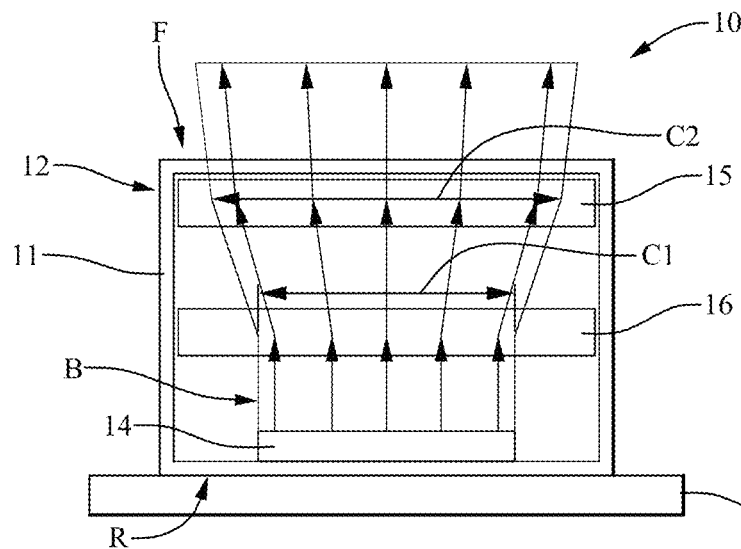
FIG. 2 is a schematic representation of the infrared-laser source device according to a first main embodiment of the present disclosure.

The present disclosure intends to solve such a concern by suppressing or at least drastically reducing the aforementioned red-glow effect. To this end, FIG. 2 shows, as first embodiment of the present disclosure, an infrared-laser source device 10 provided with an external housing 11. The external housing 11 basically includes the same elements as those described in connection with FIG. 1, namely:

a light output interface 12 arranged in a front part F of the external housing, at least one infrared-laser source 14 arranged in a rear part R of the external housing 11, the infrared-laser source 14 being able to emit an IR-laser beam B which provides a first emitting area C1 at the light output interface 12, and a first light distributing element 15 that diverges light at the light output interface 12.

Contrary to FIG. 1, the infrared-laser source device 10 of the present disclosure further includes a second light distributing element 16 separated from the first light distributing element 15 and providing, at the light output interface 12, a second emitting area C2 larger than the first emitting area C1.

Figure 3:
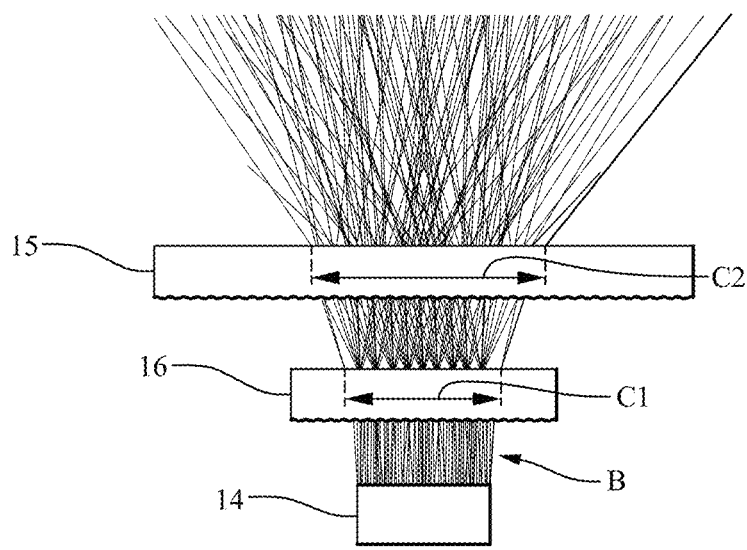
FIG. 3 shows, more specifically, a schematic representation of the IR-laser beam within the device of FIG. 2, so as to better illustrate one of the technical effects provided by the present disclosure, FIG. 4 provides a graph comparison of the effects provided by the prior art, shown on the left side, with respect to the present disclosure, shown on the right side, when looking the laser beam as it appears on the light output interface from outside of the device, on the upper part of the figure, and when looking the laser beam as it appears on a target surface, on the bottom of the figure.

Due to the infrared-laser source device 10, the light emitting surface C2, as it appears for a person looking thereto, is increased relative to the first emitting area C1 due to the second light distributing element 16. This effect is schematically depicted in FIG. 3 which shows that the IR-laser beam B, issued from the infrared laser source 14, is successively enlarged by the second and first light distributing elements 16, 15, so as to provide the first and second emitting areas C1, C2 respectively. The second emitting area C2 is clearly larger than the first emitting area C1. As a result, the radiance of the second emitting area C2 is advantageously reduced while maintaining the other main parameters of the laser beam B, namely the power of the light and the desired angular distribution on the target surface.

Figure 4:
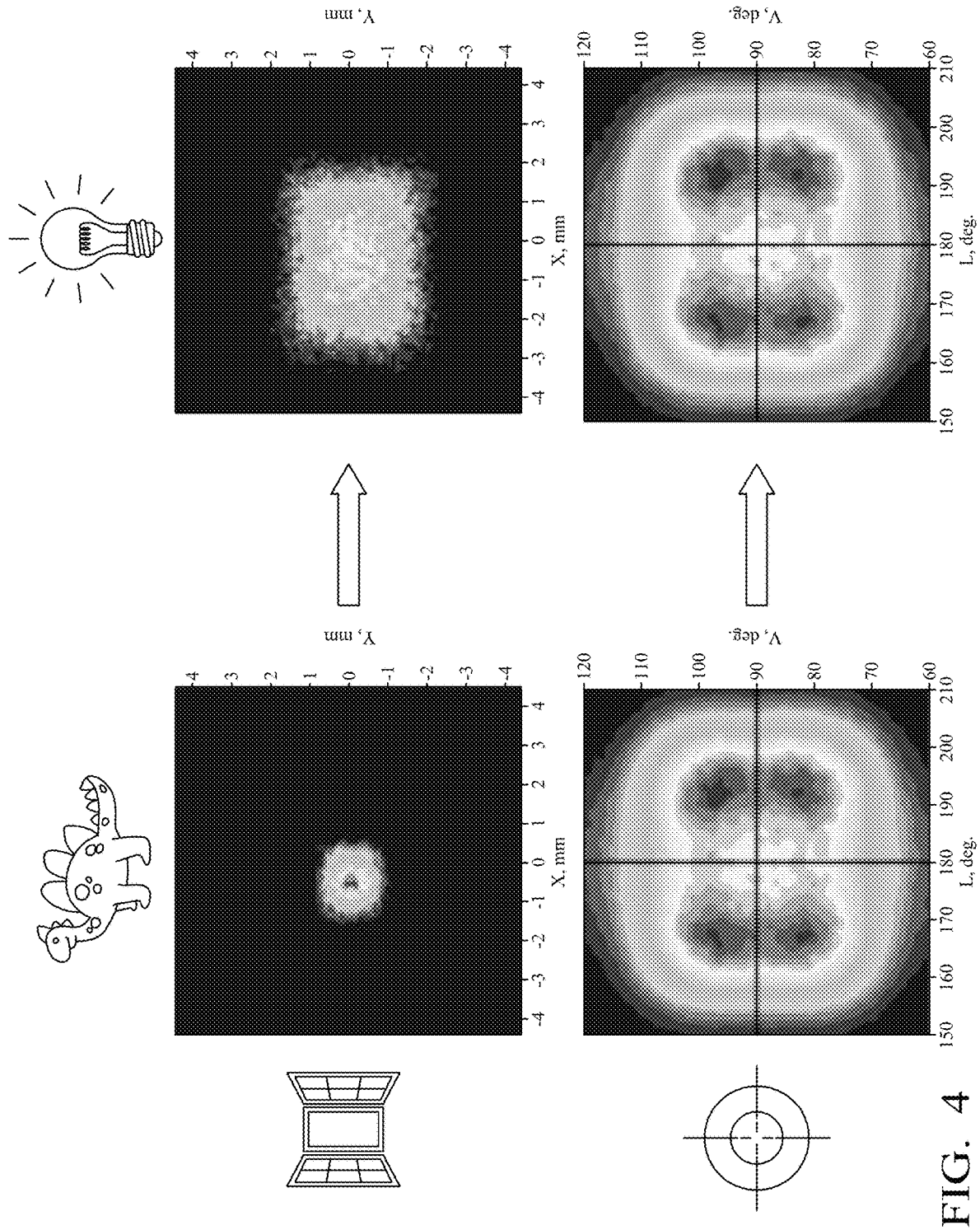

FIG. 4 is a pattern comparison showing the benefit provided by the present disclosure (on the right side of the figure) with respect to the prior art shown (on the left part of the figure). The upper part of the figure shows two black square zones, each having a side of a little more than 8 mm. Within each of these black square zones is represented the emitting area at the light output interface 12 as it appears, on the one hand, for the laser source device 1 of the prior art (on the left side) and, on the other hand, for the infrared-laser source device 10 of the present disclosure (on the right side). Each of the emitting area C2 is located at the exit surface of the external housing 11 of the related laser source device 1, 10. Accordingly, the exit surface has been schematically marked by a pictogram showing an opened window. One can note that the emitting area of the prior art is very small (the pattern is about 2×2 mm) thus providing a concentrated radiance, while the emitting area of the present disclosure (which corresponds to the second emitting area C2) is much larger (the pattern is about 5×4 mm) thus providing a reduced radiance.

The same power has been used for energizing the infrared laser source 14 providing the IR-laser beam B. Accordingly, one can note that the same power used for illuminating a larger surface leads to lower the intensity. Therefore, any person looking at the second emitting area C2 provided by the infrared-laser source device 10 will no longer be disturbed or much less disturbed by the dark-red-glow. Accordingly, the present disclosure provides key-advantages including, among others, relaxed eye-safety conditions, no or much lower perceptibility of the IR-light and no longer or reduced laser speckles (i.e. small spots or patches of colors).

At the bottom of FIG. 4, the two lower squares represent the light distribution provided by the corresponding emitting area on a target surface. Accordingly, the lower row of squares has been schematically marked by a pictogram which represents a target. One can see that the light distribution on the target surface is the same or substantially the same for the device 1 of the prior art as for the device 10 of the present disclosure. More specifically, the target surface covered by the laser beam B has an aperture of about 60°, both on the horizontal axis and on the vertical axis, and the intensity of the light within the target surface is the same, or almost the same, for the device 1 of the prior art as that of the present disclosure. This means that the emitting areas of the exit surfaces as they appear on the device 1 of the prior art and on the device 10 of the present disclosure provide both the same light distribution on a monitored target. However, the infrared-laser source device 10 of FIG. 2 has the advantage of providing a much lower radiance on the emitting surface C2 at the light output interface 12.

As another advantage, it should be noted that with the double-spreading of the light, as well as shown in FIG. 3, large light output areas can be obtained without massively increasing the high of the infrared-laser source device 10. Since the size of such a device 10 may be critical, especially when it is to be located inside other apparatus such as monitoring camera for example, it is important to keep an infrared-laser source device 10 having a good compactness.

The IR-laser beam B emitted by the infrared-laser source 14 is preferably in a near-infrared range. The near infrared (NIR) includes radiations in the non-visible spectrum for the human eye which extend from 780-3000 nm. In this range, laser light emits radiations in the safe portion of the electromagnetic spectrum for the human eye, provided that the radiance of the emitting area at the light output interface 12 is small enough. In such a wavelength range and for a moderate radiance, the light is mainly absorbed by the cornea and by the lens, thus preventing the light to reach the retina. Preferably, the NIR-range of the IR-laser beam emitted by the infrared laser source 14 is between 780-3000 nm, in particular between 780-1300 nm and still preferably includes 940 nm emission wavelength.

According to a preferred embodiment, the infrared-laser source 14 is a vertical cavity surface laser (VCSEL). VCSEL is a type of semiconductor laser diode with a laser beam emission perpendicular from the top surface, contrary to conventional edge-emitting semiconductor lasers which emit from surfaces formed by cleaving the individual chip out of a wafer. A typical size of VCSEL die is about 1 mm$^2$ (1×1 mm). The VCSEL laser diode or VCSEL chip has several advantages, especially in terms of production where the yield can be controlled to a more predictable outcome.

Accordingly, there is a significant interest in using the technology provided by the VCSEL.

Reverting to the light distributing elements 15, 16, they can be regarded as diffusing elements to spread the light received by each of them. These elements 15, 16 are preferably similar in design but not identical. At least one of the light distributing elements 15, 16 is made of at least one of a micro-lens array, a translucent material, a grained surface, a free-form lens or an advanced beam shaper capable of homogenizing an input beam while shaping the output intensity profile and the way light is distributed in space.

It should be noted that the light apertures provided by the light distributing elements 15, 16 are not necessarily the same. Accordingly, the spreading angle provided by one of the light distributing elements 15, 16 can differ from that of the other element. In addition, any of the light distributing elements 15, 16 may provide a symmetrical or an asymmetrical light distribution. Due to an asymmetrical light distribution, it may be possible to optimize the target surface that is e.g. to be illuminated, in particular if the infrared-laser source device 10 is off-axis with respect to the target surface.

According to one embodiment, the distance between the first light distributing element 15 and the second light distributing element 16 is made variable by an adjusting means. Such an adjusting means may be e.g. a tuning screw or a lockable sliding system able to slide the external housing 11 with respect to an internal housing 17 that will be disclosed in connection with FIG. 6. The goal of such an adjusting means may be regarded as providing the infrared-laser source device 10 adjustable, preferably once, e.g. during factory assembly. Accordingly, it may be adapted to several requirements or needs, especially in terms of field width. As a result, the distance between the infrared-laser source device 10 and the target becomes advantageously less critical.

As shown in the example of FIG. 2, the second light distributing element 16 is located between the infrared-laser source 14 and the first light distributing element 15. According to one embodiment, the second light distributing element 16 is substantially located halfway between the infrared-laser source 14 and the first light distributing element 15.

In another embodiment, the second light distributing element 16 is located at a distance between 2 and 5 mm from the first light distributing element 15. Such values give a good idea of the compactness of the infrared-laser source device 10. The distance between the two light distributing elements 15, 16 may be such that the emitting areas C1 and C2 are within a ratio equal to a factor of approximately 10, preferably between 7 and 15. For example, if the second light distributing element 16 has ±20° spread, i.e. an aperture angle of 40°, the distance between the first and second light distributing elements 15, 16 should be 3.5 mm. With such values, a typical VCSEL providing a first emitting area C1 of 1 mm$^2$ should be used with a second light distributing element 16 able to provide a second emitting area C2 of 12.6 mm$^2$, so that the second emitting area C2 may be a square area equivalent to 3.55×3.55 mm.

Figure 5:
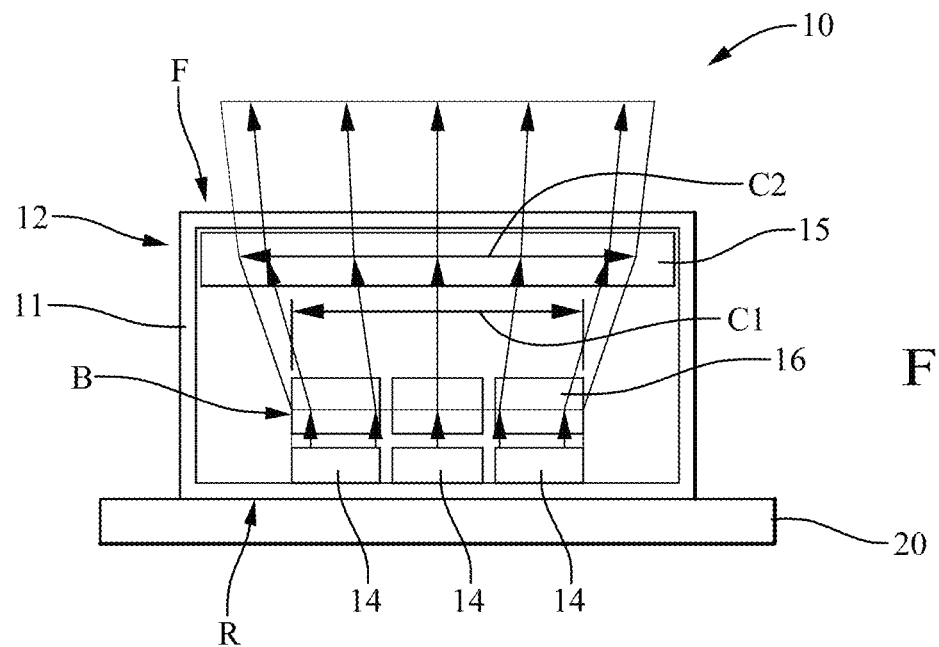
FIG. 5 is a schematic representation of a second main embodiment of the present disclosure.

FIG. 5 illustrates a second main embodiment of the infrared-laser source device 10. According to this embodiment, the infrared-laser source 14 is made of a plurality of separated elements. In addition, the second light distributing element 16 is preferably made of a micro-lens arranged onto each of these elements. In other words, a micro-lens array may be integrated into an infrared-laser source die. For example, the aforementioned plurality of elements of the infrared-laser source 14 may be a VCSEL die and the second light distributing element 16 may be an integrated diffusing element arranged on the VCSEL die. This embodiment provides a very compact result which is particularly appropriate to achieve the infrared-laser source device 10.

As shown in the embodiment of FIG. 5, the second light distributing element 16 is located at a distance which is substantially greater than the spacing between the separated elements of the infrared-laser source 14.

According to another embodiment, the first light distributing element 15 further widens the IR-laser beam B exiting the second light distributing element 16 and/or corrects the distribution of at least one portion of the IR-laser beam B. Correcting the distribution of a portion of the beam B could lead to get an asymmetric beam, e.g. in view to obtain an atypical distribution of the target lighting.

Figure 6:
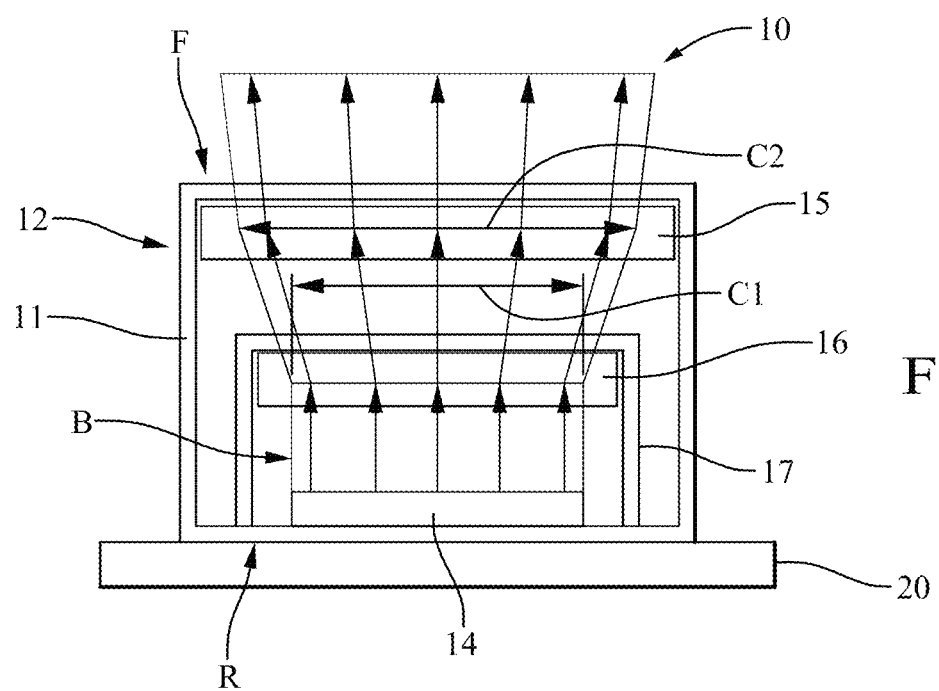
FIG. 6 is a schematic representation of a third main embodiment of the present disclosure.

FIG. 6 shows another main embodiment in which the infrared-laser source 14 and the second light distributing element 16 are arranged within an internal housing 17 which, in turn, is located inside the external housing 11. The external housing 11, together with the first light distributing element 15, could be regarded as a cover to be put onto the internal housing 17, or designed to surround the internal housing 17. Due to this embodiment, it becomes possible to enhance existing laser source devices 1 since the internal housing 17, together with the infrared-laser source 14 and the second light distributing element 16 may correspond to the infrared-laser source device 1 of FIG. 1, and since the external housing 11, together with the first light distributing element 17, may be considered as an added module mounted onto the infrared-laser source device 1. Accordingly, this embodiment appears to be an especially cost-effective solution.

The distance between the first and second light distributing elements 15, 16 may be easily set by adapting the height of the external housing 11. The internal and external housings 17, 11 may be rigidly attached to each other or may be bound via an adjusting means enabling the aforementioned distance to be adjusted. Preferably, the external housing 11 is an add-on with respect to the internal housing 17. Still preferably, both the internal and external housings 17, 11 are secured onto a printed circuit board 20, as shown in FIG. 6. In one embodiment, the internal housing 17 is fitted to the external housing 11, and the external housing 11 is mounted onto the printed circuit board 20 using any fastening means, including soldering.

According to a further embodiment, at least one of the external housing 11 and the internal housing 17 includes a translucent material, such as plastic or glass, acting as light output interface 12. The translucent material may be a portion of the housings 11, 17 arranged in their front part F, or may be used as base material for the entire housings, more specifically for the entire of at least one of these housings.

Figure 7A:
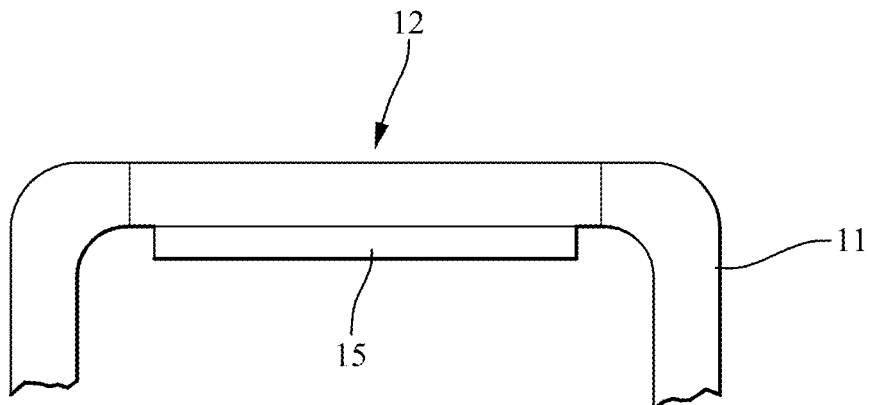
FIGS. 7A to 7C show, as variants of any embodiments of the present disclosure, details regarding the front part of the external housing, and/or the internal housing if any, FIG. 8 schematically depicts a lighting device provided with the infrared-laser source device of the present disclosure.
Figure 7B:
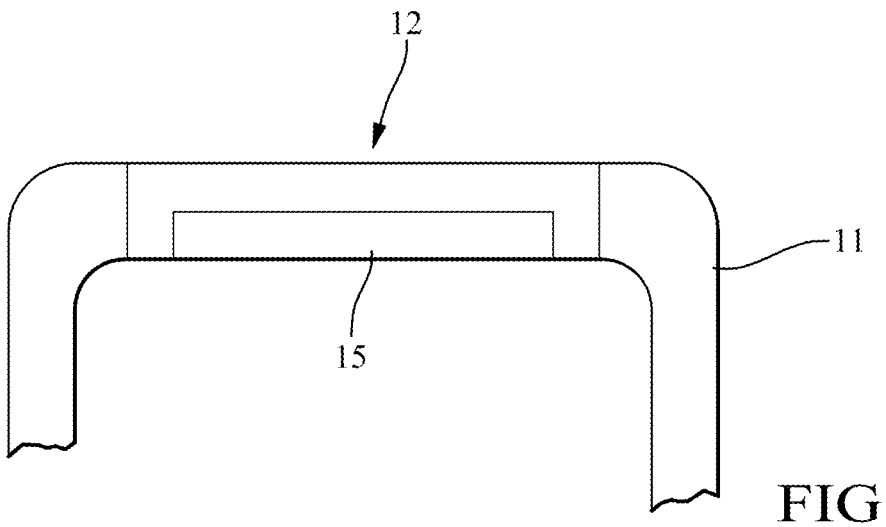
Figure 7C:
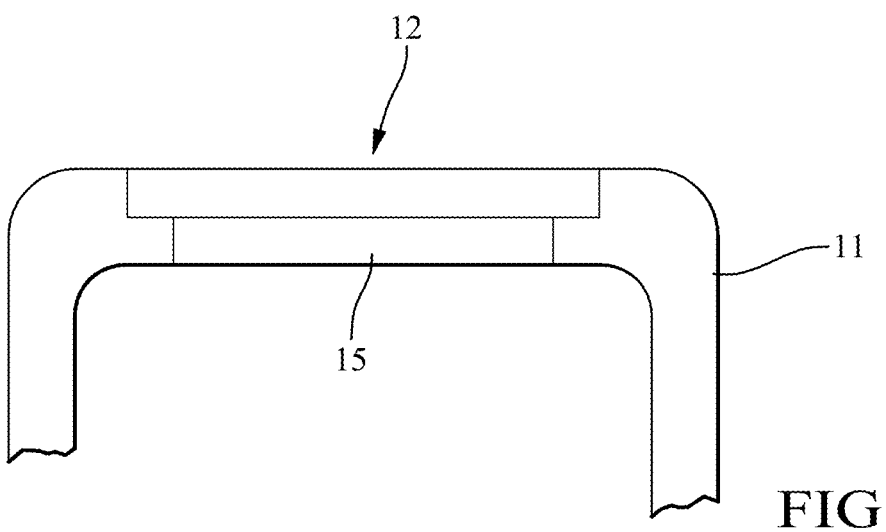

As shown in FIGS. 7A-7C, preferably at least one of the first light distributing element 15 and the second light distributing element 16 is integrated to or arranged against the external housing 11, respectively the internal housing 17. Although FIGS. 7A-7C show a portion of the external housing 11, in particular the front part F of the housing provided with the first light distributing element 15 at the light output interface 12, it should be noted that the same layouts could be applied to the internal housing 17 for example. According to FIGS. 7A-7C, the light output interface 12 is made of a translucent material portion of the external housing 11.

According to the variant shown in FIG. 7A, the first light distributing element 15 is arranged against the front part F of the external housing 11, in particular against the internal face of the external housing 11 at the output interface 12. For example, in the variant of FIG. 7A, the first light distributing element 15 may be a separate part glued to the translucent window of the external housing 11.

According to the variant of FIG. 7B, the first distributing element 15 is, at the light output interface 12, integrated within the front part F of the external housing 11, more specifically within the thickness of the external housing 11, while being protected by a translucent window acting as at least a portion of the light output interface 12. For example, the first light distributing element 15 may be embossed during a molding process of the external housing 11 or at least of the window of the external housing 11. Alternatively, the window part of the external housing 11 may be machined to form a recess into which the light distributing element 15 may be glued for instance.

The third variant of FIG. 7C shows another embodiment in which the first light distributing element 15 is also integrated within the thickness of the external housing 11 which may act as a cover for the other elements of the infrared-laser source device 10. In this variant, the translucent material portion (used as window for the IR-laser beam B) and the first light distributing element 15 have their own recess within the external housing 11. Each of them may be glued to the housing, for example.

Figure 8:
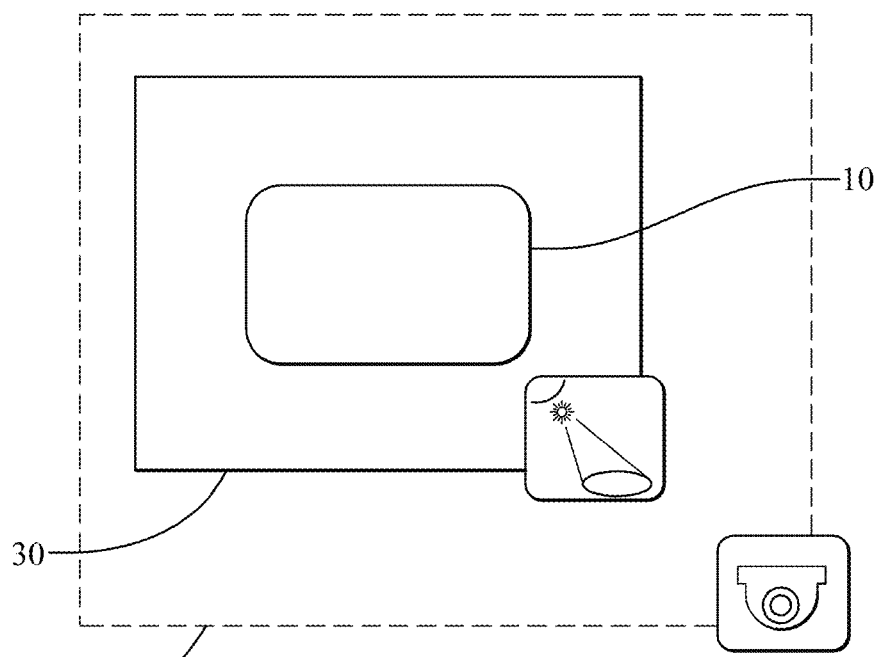

As schematically depicted in FIG. 8, the present disclosure also relates to a lighting device 30 for a camera 40, preferably a monitoring camera. The lighting device 30 includes the infrared-laser source 10 according to any of its embodiments, or any possible combination of its embodiments previously disclosed. The lighting device 30 may be appended to the camera 40 or it may be embedded within the camera as illustrated in FIG. 8. As variant, the present disclosure may also relate to a camera 40, preferably a monitoring camera, including the infrared-laser source 10 according to any of its embodiments, or any possible combination of its embodiments. The monitoring camera may monitor in-cabin of a vehicle for example.

Figure 9:
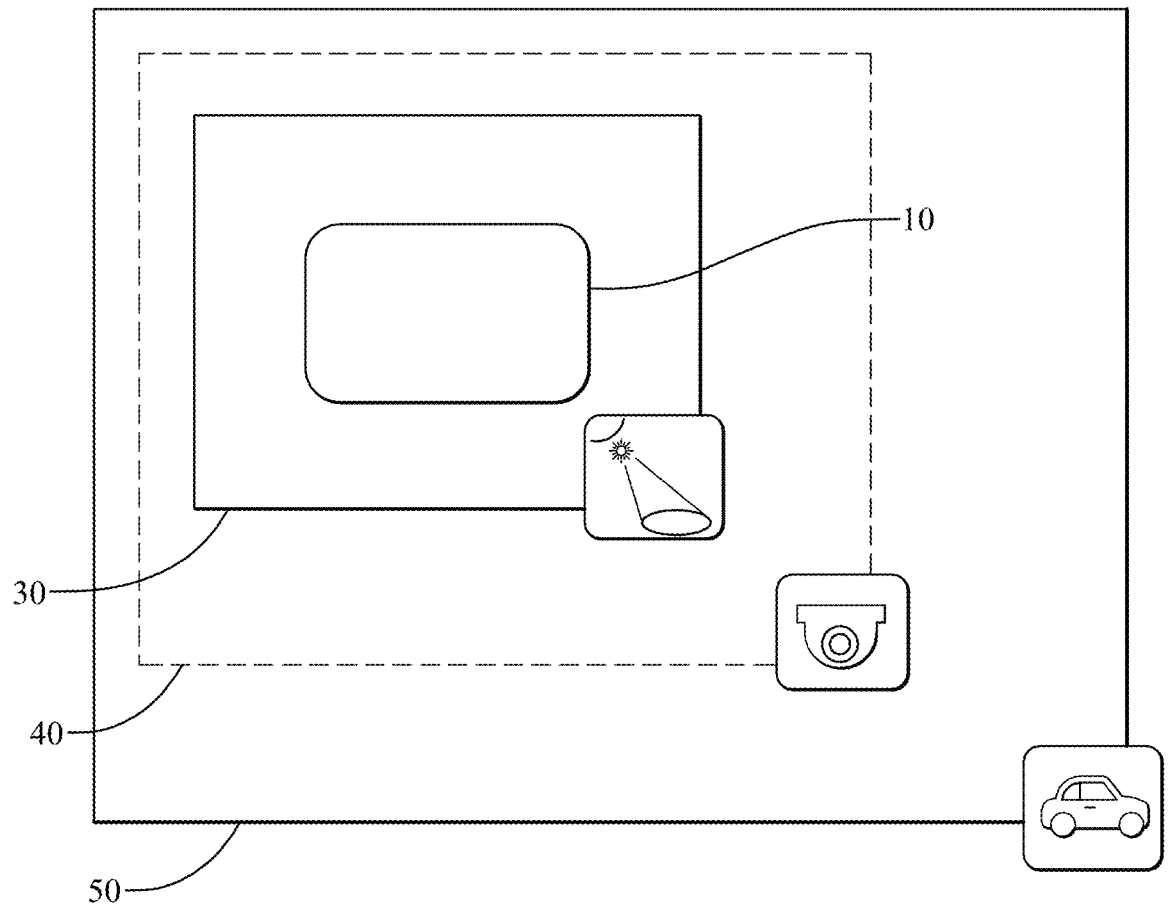
FIG. 9 is a schematic illustration of a motor vehicle including the lighting device of FIG. 8.

As schematically depicted in FIG. 9, the present disclosure also relates to a vehicle 50, preferably a motor vehicle, including the aforementioned lighting device 30 or camera 40 which is preferably a monitoring camera as that mentioned above.

The present disclosure further relates to a printed circuit board 20 including the infrared-laser source 10 according to any of its embodiments, or any possible combination of its embodiments.

Although an overview of the inventive subject matter has been described with reference to specific example embodiments, various modifications and changes may be made to these embodiments without departing from the broader spirit and scope of embodiments of the disclosure disclosed in the present description.

What is claimed is:

1. An infrared-laser source device provided with an external housing, said external housing comprising:
    a light output interface arranged in a front part of the external housing;
    at least one infrared-laser source arranged in a rear part of the external housing and configured to emit an IR-laser beam;
    a first light distributing element configured to diverge light at the light output interface; and
    a second light distributing element that is separate from the first light distributing element
    wherein the second light distribution element and the first light distribution element are configured to successively enlarge the IR-laser beam so as to provide an enlarged emitting area at the light output interface,
    the first light distributing element is integrated into or arranged against the external housing, and
    the infrared-laser source and the second light distributing element are arranged within an internal housing which is located inside the external housing.

2. The infrared-laser source device according to claim 1, wherein the IR-laser beam emitted by the infrared-laser source is in a near-infrared range.

3. The infrared-laser source device according to claim 1, wherein the infrared-laser source is a vertical cavity surface emitting laser.

4. The infrared-laser source device according to claim 1, wherein at least one of the first light distributing element or the second light distributing element is made of at least one of:
    a micro-lens array;
    a translucent material;
    a grained surface;
    a free-form lens; or
    an advanced beam shaper capable of homogenizing an input beam while shaping an output intensity profile and a way light is distributed in space.

5. The infrared-laser source device according to claim 1, wherein a distance between the first light distributing element and the second light distributing element is made variable by an adjusting means.

6. The infrared-laser source device according to claim 1, wherein the second light distributing element is located at a distance comprised between 2 and 5 mm from the first light distributing element.

7. The infrared-laser source device according to claim 1, wherein the infrared-laser source is made of a single element and the second light distributing element is substantially located halfway between the infrared-laser source and the first light distributing element.

8. The infrared-laser source device according to claim 1, wherein the infrared-laser source is made of a plurality of separated elements and the second light distributing element is made of a micro-lens arranged onto each of said elements.

9. The infrared-laser source device according to claim 1, wherein the first light distributing element is configured to further widen the IR-laser beam exiting the second light distributing element or correct the distribution of at least one portion of said IR-laser beam.

10. The infrared-laser source device according to claim 1, wherein the external housing is an add-on with respect to the internal housing.

11. The infrared-laser source device according to claim 1, wherein at least one of the external housing or the internal housing has a translucent material acting as light output interface.

12. The infrared-laser source device according to claim 11, wherein the translucent material comprises plastic or glass.

13. The infrared-laser source device according to claim 1, wherein the second light distributing element is integrated into or arranged against the internal housing.

14. A system, comprising:
    a camera for in-cabin monitoring of a vehicle; and
    a lighting device to illuminate a cabin of the vehicle, the lighting device comprising an infrared-laser source device provided in an external housing, the infrared-laser source device comprising:
        a light output interface arranged in a front part of the external housing;

at least one infrared-laser source arranged in a rear part of the external housing and configured to emit an IR-laser beam;

a first light distributing element configured to diverge light at the light output interface; and a second light distributing element that is separate from the first light distributing element, wherein the second light distribution element and the first light distribution element are configured to successively enlarge the IR-laser beam so as to provide an enlarged emitting area at the light output interface, the first light distributing element is integrated into or arranged against the external housing, and the infrared-laser source and the second light distributing element are arranged within an internal housing which is located inside the external housing.

15. The system of claim 14, wherein the IR-laser beam emitted by the infrared-laser source is in a near-infrared range.

16. The system of claim 14, wherein the infrared-laser source is a vertical cavity surface emitting laser.

17. The system of claim 14, wherein at least one of the first light distributing element or the second light distributing element is made of at least one of:
- a micro-lens array;
- a translucent material;
- a grained surface;
- a free-form lens; or
- an advanced beam shaper capable of homogenizing an input beam while shaping an output intensity profile and a way light is distributed in space.

18. The system of claim 14, wherein a distance between the first light distributing element and the second light distributing element is made variable by an adjusting means.

19. The system of claim 14, further comprising the vehicle, the vehicle including the camera and the lighting device.

* * * * *